United States Patent
Jain et al.

(10) Patent No.: US 7,670,917 B2
(45) Date of Patent: Mar. 2, 2010

(54) SEMICONDUCTOR DEVICE MADE BY USING A LASER ANNEAL TO INCORPORATE STRESS INTO A CHANNEL REGION

(75) Inventors: Amitabh Jain, Allen, TX (US); Manoj Mehrotra, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 83 days.

(21) Appl. No.: 11/853,328

(22) Filed: Sep. 11, 2007

(65) Prior Publication Data

US 2009/0065880 A1    Mar. 12, 2009

(51) Int. Cl.
*H01L 21/336* (2006.01)
*H01L 21/31* (2006.01)
*H01L 21/469* (2006.01)

(52) U.S. Cl. .............. 438/308; 438/365; 438/305; 257/412; 257/E29.345; 257/E21.345; 257/E21.409

(58) Field of Classification Search .......... 257/412, 257/E29.345, E21.409; 438/223, 199, 301, 438/308

See application file for complete search history.

(56) References Cited

U.S. PATENT DOCUMENTS

| | | | |
|---|---|---|---|
| 2003/0025167 A1* | 2/2003 | Park et al. | 257/408 |
| 2007/0108525 A1* | 5/2007 | Yang et al. | 257/351 |
| 2008/0230841 A1* | 9/2008 | Quek et al. | 257/369 |

\* cited by examiner

*Primary Examiner*—Fernando L Toledo
*Assistant Examiner*—Mamadou Diallo
(74) *Attorney, Agent, or Firm*—Warren L. Franz; Wade J. Brady, III; Frederick J. Telecky, Jr.

(57) ABSTRACT

In one aspect there is provided a method of manufacturing a semiconductor device comprising forming gate electrodes over a semiconductor substrate, forming source/drains adjacent the gate electrodes, depositing a stress inducing layer over the gate electrodes. A laser anneal is conducted on at least the gate electrodes subsequent to depositing the stress inducing layer at a temperature of at least about 1100° C. for a period of time of at least about 300 microseconds, and the semiconductor device is subjected to a thermal anneal subsequent to conducting the laser anneal.

17 Claims, 6 Drawing Sheets

US 7,670,917 B2

SEMICONDUCTOR DEVICE MADE BY USING A LASER ANNEAL TO INCORPORATE STRESS INTO A CHANNEL REGION

TECHNICAL FIELD OF THE INVENTION

The invention is directed, in general, to a semiconductor device having a stress in a channel region thereof; and, more specifically, to a semiconductor device made by using a laser anneal to incorporate that stress into the channel region.

BACKGROUND OF THE INVENTION

There exists a continuing need to improve semiconductor device performance and further scale semiconductor devices. A characteristic that limits scalability and device performance is electron and/or hole mobility (e.g., also referred to as channel mobility) throughout the channel region of transistors. As devices continue to shrink in size, the channel region also continues to shrink in size, which can limit channel mobility.

One technique that improves scaling limits and device performance is the introduction of strain into the channel region, which can improve electron and/or hole mobility. Different types of strain, including expansive strain, uniaxial tensile strain, and compressive strain, have been introduced into channel regions of various types of transistors in order to determine their effect on electron and/or hole mobility. For some devices, certain types of strain improve mobility whereas other types degrade mobility.

One process known and used to create strain within the channel region is to form a layer of strain inducing material over the gate structure. The strain inducing material is then subjected to a furnace thermal annealing process to create the strain within the channel region. While the stress induced by such processes has shown an improvement in transistor performance, further improvements in device performance may be desired, as devices continue to become even smaller.

SUMMARY OF THE INVENTION

To address the above-discussed deficiencies of the prior art, one aspect of the invention provides a method of manufacturing a semiconductor device. In this embodiment, the method comprises forming silicon gate electrodes over a semiconductor substrate, including forming amorphous regions in the silicon gate electrodes, and forming source/drain regions adjacent each of the silicon gate electrodes. An oxide layer is deposited over the silicon gate electrodes and the source/drains, and a nitride layer is deposited over the oxide layer. A laser anneal is conducted on at least the silicon gate electrodes subsequent to depositing the nitride layer at a temperature ranging from about 1100° C. to about 1350° C. for a period of time ranging from about 300 microseconds to about 2000 microseconds. The semiconductor device is subjected to a thermal anneal subsequent to conducting the laser anneal at a temperature ranging from about 1000° C. to about 1100° C. for a time ranging from about 0.6 seconds to about 2.0 seconds.

In another embodiment there is provided a method of manufacturing a semiconductor device comprising forming gate electrodes over a semiconductor substrate, forming source/drains adjacent each of the gate electrodes, and depositing a stress inducing layer over the gate electrodes. A laser anneal is conducted on at least the gate electrodes subsequent to depositing the stress inducing layer, at a temperature of at least about 1100° C. for a period of time of at least about 300 microseconds, and the semiconductor device is subjected to a thermal anneal subsequent to conducting the laser anneal.

In another embodiment, there is provided a semiconductor device. The semiconductor device comprises polysilicon gate electrodes located over a semiconductor substrate, source/drains located adjacent the polysilicon gate electrodes, and a channel region located between each of the source/drains, wherein the channel region has a stress incorporated therein. The stress is incorporated by forming the polysilicon gate electrodes including forming an amorphous region in each of the polysilicon gate electrodes, depositing an oxide layer over the silicon gate electrodes and the source/drains, and depositing a nitride layer over the oxide layer. A laser anneal is conducted on the silicon gate electrodes subsequent to depositing the nitride layer, at a temperature ranging from about 1100° C. to about 1350° C. for a period of time ranging from about 600 microseconds to about 800 microseconds. The laser anneal at least partially recrystallizes the amorphous region in each of the silicon gate electrodes. The semiconductor device is subjected to a thermal anneal subsequent to conducting the laser anneal at a temperature ranging from about 1000° C. to about 1100° C. for a time ranging from about 0.6 seconds to about 2.0 seconds.

BRIEF DESCRIPTION OF THE DRAWINGS

For a more complete understanding of the invention, reference is now made to the following descriptions taken in conjunction with the accompanying drawings, in which.

DETAILED DESCRIPTION

The invention recognizes the benefit of annealing a stress inducing layer, such as a nitride cap layer, located over a gate electrode using a short (less than one second) laser anneal prior to conducting a thermal anneal. Due to the extreme high temperatures that can be achieved with the laser anneal, more stress can be incorporated into the channel region under the gate electrode. The embodiments discussed herein not only achieve more stress than conventional processes, but they do so without causing excess diffusion of source/drain dopants due to the limited amount of time that the gate electrodes are subjected to the laser anneal. The added stress, as achieved by the invention, enhances transistor performance.

Figure 1:
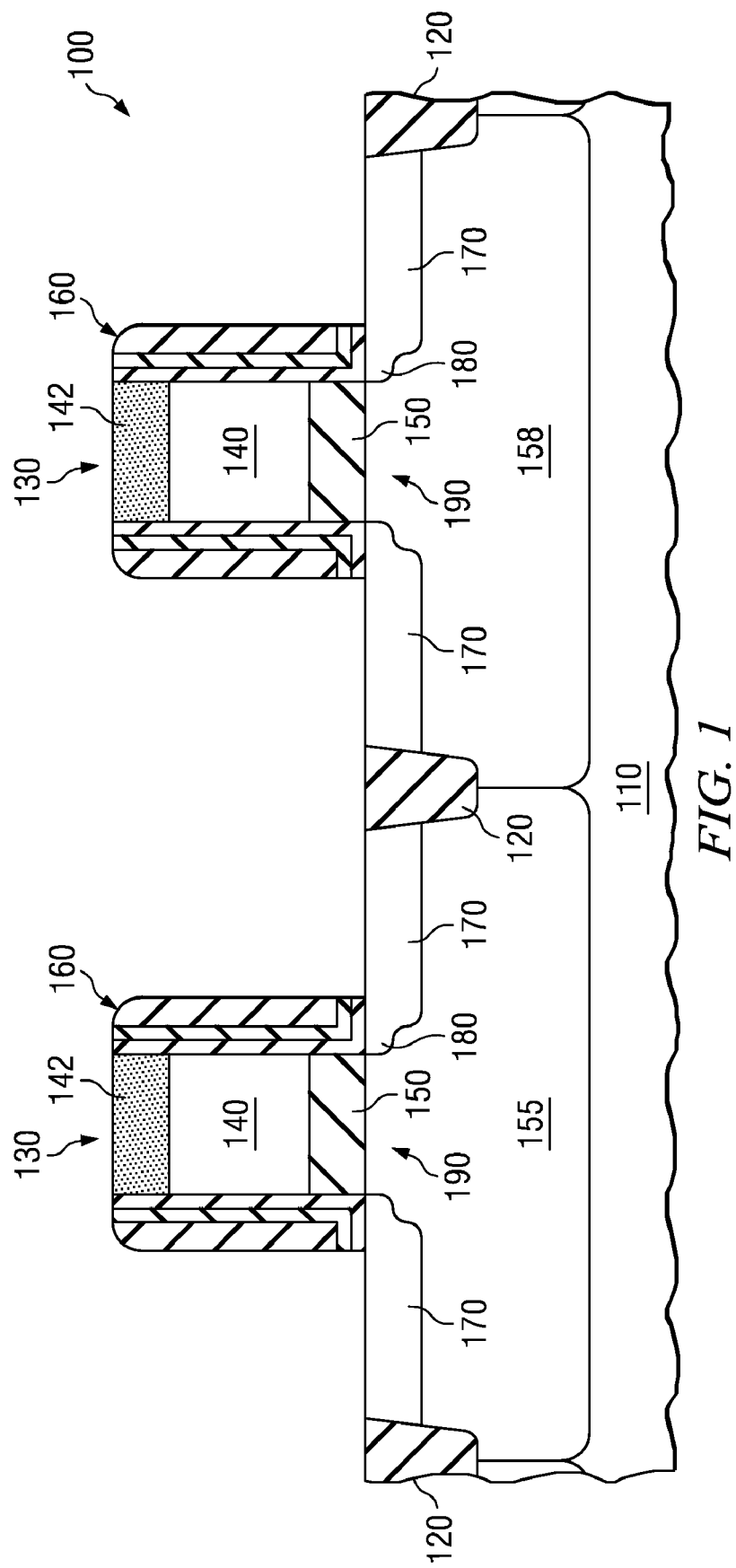
FIG. 1 illustrates an embodiment of a semiconductor device of the invention.

FIG. 1 illustrates a semiconductor device 100 as provided by the embodiments discussed herein. Reference is made throughout this discussion to the structural elements of FIG. 1. The device 100 may be a MOS device, such as an nMOS, or it may have both nMOS and pMOS type of devices configured as a CMOS device. The embodiments described herein are not limited to only nMOS or PMOS devices, but are applicable to any sub-micron device where channel stress is beneficial. The device 100 includes a substrate 110, which may be any layer located over a silicon wafer, such as an epitaxial layer, or it may be a doped region of the silicon wafer itself. Isolation structures 120 are located in the substrate 110. Gate structures 130 include a gate electrode 140 and a gate dielectric 150 that isolates the gate structure 130 from wells 155 and 158, respectively. Conventional processes and materials may be used to form these structures. In the illustrated embodiment, at least one of the two gate structures 130 is configured as an nMOS device.

Sidewall spacers 160, which also may be conventional, are formed on the sidewalls of the gate structures 130. The device further includes source/drains 170, which may include source/drain extensions 180. The source/drains 170 and extensions 180 may be formed using conventional dopants and implantation processes. The gate electrodes 140 include an amorphous region 142. The way in which this amorphous region may be formed can vary, depending on the fabrication process. For example, the in one embodiment, the amorphous region may be formed during the implantation of the dopants that form source/drains 170. The impact of the dopants on the gate electrode 140 can destroy the crystalline structure to form the amorphous region 142. In such instances, the depth of the amorphous region will depend on the extent of the implantation. As explained below, these regions are recrystallized during subsequent processes.

In another embodiment, the amorphous region may be formed during the deposition of the material, e.g., polysilicon, used to form the gate electrodes 140. In this aspect, it should be understood that even if deposited as 100% pure amorphous material, some recrystallization may occur, thereby causing some recrystallized material to be present.

A channel region 190, having a stress as provided herein, is located between the source/drains 170. Due to the advantages provided by the embodiments herein, the amount of stress that is incorporated into the channel region 190 is greater for than the stress achievable using conventional processes.

Figure 2:
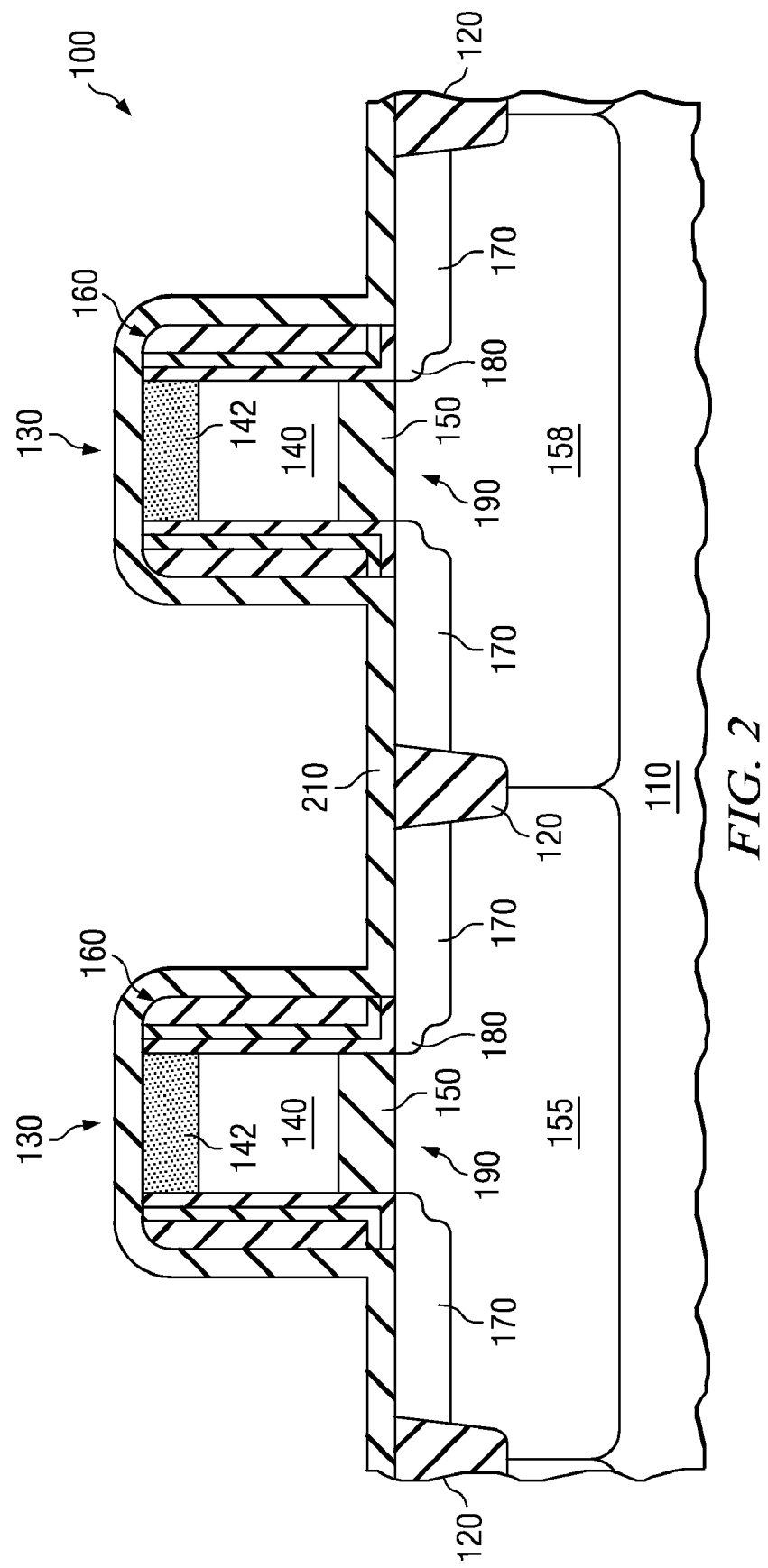
FIG. 2 illustrates the semiconductor device of FIG. 1 after the formation of a protective layer.

FIG. 2 illustrates the device 100 after the deposition of an optional protective layer 210. When present, the protective layer 210, in one embodiment, may be a single layer or multiple layers of silicon oxide. Moreover, conventional processes may be used to form the optional protective layer 210. The layer 210 may serve as an etch stop on which to stop an etch process used to remove overlying layers, such as a nitride layer. The layer 210 prevents the etch from proceeding into the underlying silicon. The thickness of the protective layer 210 may vary, but should have a thickness and etch selectivity sufficient to function as an etch stop layer. For example, the thickness may range from about 50 angstroms to about 100 angstroms.

Figure 3:
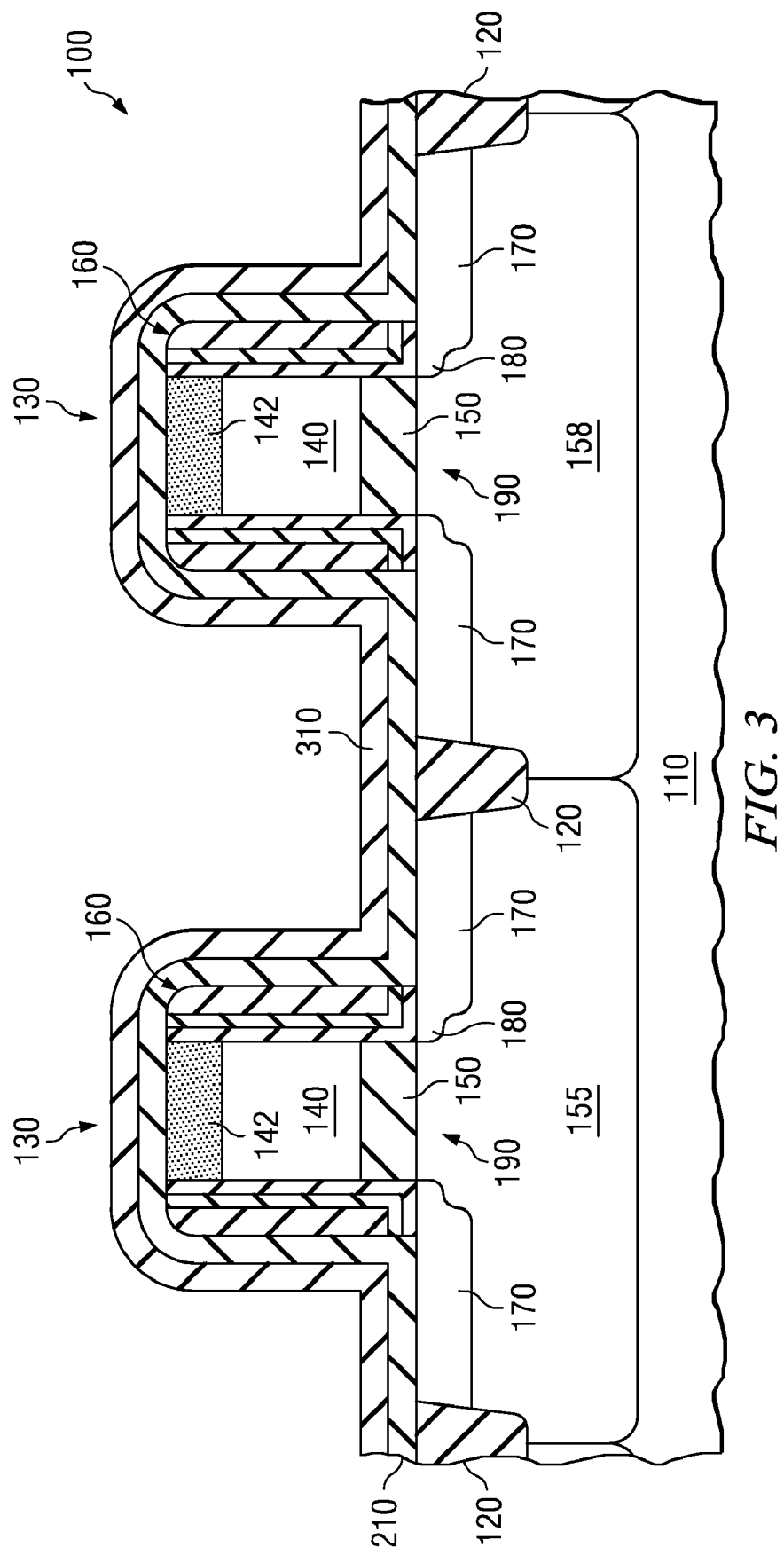
FIG. 3 illustrates the semiconductor device of FIG. 2 after the formation of a stress inducing layer.

FIG. 3 illustrates the device 100 after the deposition of a stress inducing layer 310. As used herein a stress inducing layer 310 may be a single layer or may be one of a multiple number of layers that form a laminated layer of material that is used to incorporate stress into the substrate 110, including the channel region 190, upon the annealing process discussed herein. The stress inducing layer 310 may be the first of several stress inducing layers that are formed over the gate structures 130 and the adjacent source/drains 170. In one embodiment, the stress inducing layer 310 is a nitride layer, which includes any layer that comprises nitrogen, and it may be formed using conventional processes. For example in one embodiment, the nitride layer may be a silicon nitride formed by chemical vapor deposition (CVD), or in another embodiment, the nitride layer may be an oxynitride layer. Deposition conditions might vary depending on the type of deposition tool being used. However, in one embodiment, SiH4 is flowed at a rate ranging from about 50 sccm to about 700 sccm and either N2 or NH3 is flowed at a rate ranging from about 500 sccm to about 6000 sccm. These gases may be flowed with an inert gas, such as argon or helium at a rate of about 15 liters/sec. The deposition pressure may range from about 1 torr to about 50 torr, and the temperature may range from about 300° C. to about 500° C. Additionally, if the stress inducing layer 310 is laminated, the lamination or deposition time for the stress inducing layer 310 may range from about 1 second to about 20 seconds, depending on the targeted thickness. In another embodiment, the stress inducing layer 310 may include other stress inducing materials known to those skilled in the art, such as a silicon-rich nitride or silicon carbide, either of which may be deposited using conventional processes.

In the illustrated embodiment of FIG. 3, the dopants in the source/drains 170 and extensions 180 have not been activated nor have the amorphous regions 142 in the gate electrodes 140 been recrystallized. However, after the formation of the stress inducing layer 310, the laser anneal used to incorporate stress into the channel 190, in one embodiment, can also be used to at least partially activate the dopants and recrystallize the amorphous region 142. The thickness of the stress layer 310 may vary, but the thickness should be sufficient to impart stress into the channel region 190, and yet not be so thick that does it can accommodate the pitch or distance between the gate electrodes 140. For example, in one embodiment, the stress inducing layer 310 may have a thickness of about 100 to about 800 angstroms. This range of thickness has been found, depending on the size and pitch of the gate structures 130, to impart the desired amount of stress and is capable of being deposited between the gate structures 130.

In the illustrated embodiment of FIG. 3, the dopants in the source/drains 170 and extensions 180 have not been activated nor have the amorphous regions 142 in the gate electrodes 140 been recrystallized. However, after the formation of the stress inducing layer 310, the laser anneal used to incorporated stress into the channel 190, in one embodiment, can also be used to at least partially activate the dopants and recrystallize the amorphous region 142. The thickness of the stress layer 310 may vary, but the thickness should be sufficient to impart stress into the channel region 190, and yet not be so thick that does it accomodate the pitch or distance between the gate electrodes 140. For example, in one embodiment, the stress inducing layer 310 may have a thickness has been found, depending on the size and pitch of the gate structures 130 to impart the desired amount of stress and is capable of being deposited between the gate structures 130.

Figure 4:
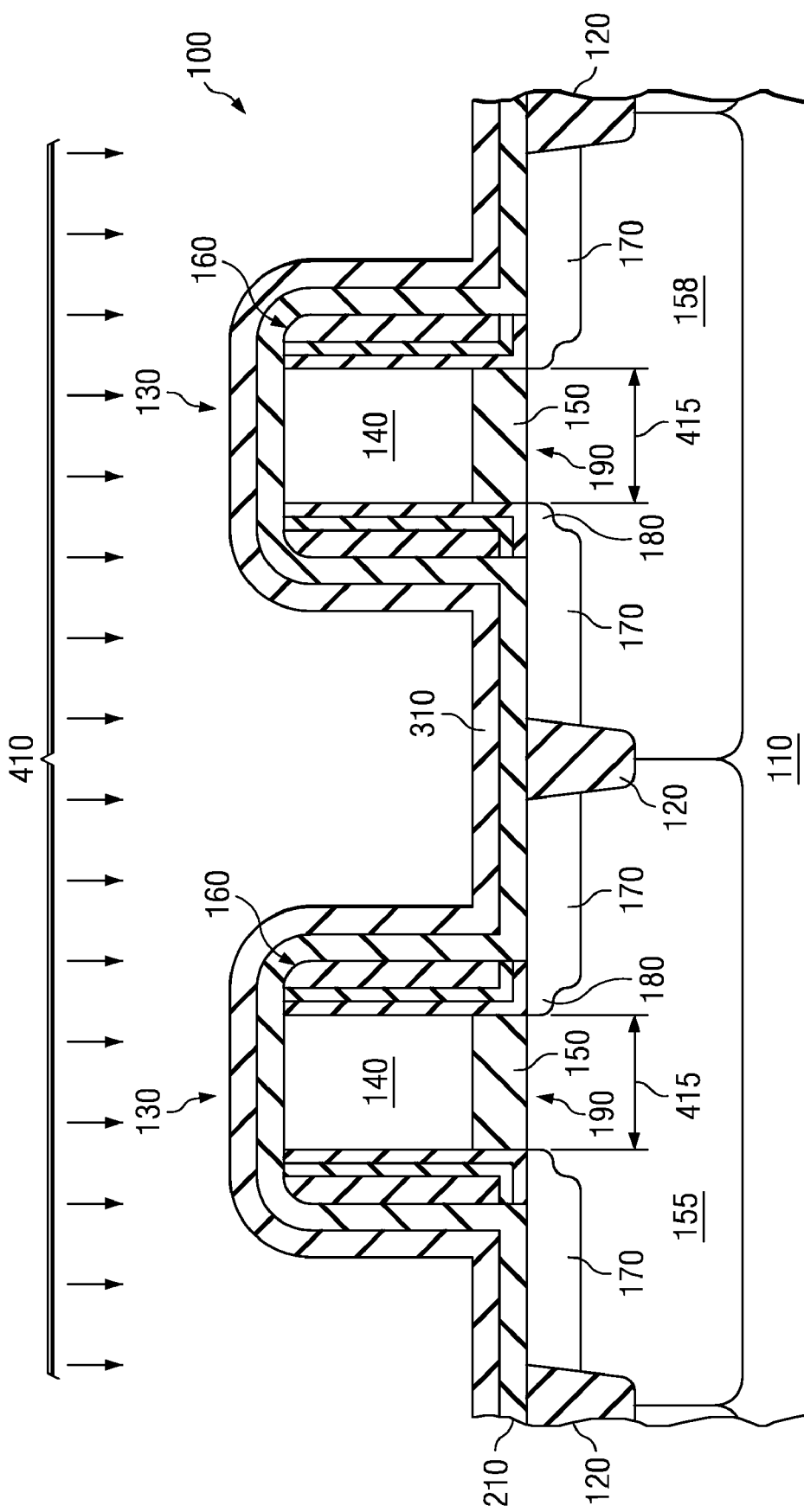
FIG. 4 illustrates the semiconductor device of FIG. 3 undergoing a laser anneal.

FIG. 4 illustrates the device 100 of FIG. 3 during a laser anneal process 410. The laser anneal process 410, in one embodiment can be used to incorporate a stress 415 into the channel region 190. The laser anneal process 410 is conducted prior to conventional thermal anneals typically used to activate source/drains 170 or recrystallize amorphous regions located in the gate electrodes 140 or the source/drains 170.

In one aspect, a short laser anneal is conducted on at least the gate electrodes 140 subsequent to depositing a nitride layer over gate electrodes 140. Here, the laser anneal is conducted at a temperature of at least about 1100° C. and for a period of time of at least about 300 microseconds. The power or wattage used will depend on the type of laser being used, for example, the wattage may be about 3000 watts. In another embodiment, the anneal temperature achieved by the laser anneal 410 ranges from about 1100° C. to about 1350° C. for a period ranging from about 300 microseconds to about 2000 microseconds. In one particular embodiment, the anneal temperature of the laser anneal 410 may be about 1300° C. and the anneal time may range from about 600 microseconds to about 800 microseconds.

The stated times are dwell times or residence times during which the laser energy impinges any given gate electrode 140. The laser can be rastered across the wafer on which the device 100 is located to target the individual gate electrodes 140 such that each experiences substantially the same dwell or residence time.

The above-stated temperature ranges are beneficial, because they incorporate a greater amount of stress 415 into the channel region 190 when compared to devices that are annealed using only conventional, furnace anneal processes, as discussed below. In turn, this enhances transistor performance over those conventional devices. Additionally, the laser anneal 410 causes the amorphous regions 142 to at least partially, if not totally, recrystallize and activate the dopants in the source/drains 170. Whatever regrowth process is occurring in the gate electrode 140, it is growing at a much higher temperature than those achieved using conventional furnace thermal anneals. It is believed that this high temperature growth causes greater mismatch in the thermal coefficient of expansion between the stress inducing layer 310 and the gate electrode 140. The intrinsic stress that the gate electrode 140 receives is by virtue of the regrowth mechanism, and its regrowing when the silicon is recrystallizing in the presence of the stress inducing layer 310, which imparts the stress 415 into the channel 190. Thus, the higher the temperature the more the mismatch and the more stress transferred to the channel region 190. The stated period of times are also beneficial because the period must be long enough to cause the amorphous region to recrystallize and impart the stress 415 into the channel region 190, but not yet too long such that excess diffusion of the dopants or melting of the substrate 110 might occur.

In one aspect, following the laser anneal 410 and before a thermal anneal is conducted, the stress inducing layer 310 may be removed using a conventional etch process that is selective to the underlying protective layer 210. The removal of the stress inducing layer 310 at this point is beneficial in those instances where no further stress induction or dopant activation is needed, thereby rendering a thermal anneal unnecessary. In those instances where the protective layer 210 is also present, it also may be removed with a conventional etch chemistry so that silicide contacts may be formed. In another embodiment, however, the stress inducing layer 410 may be left in place until a subsequent thermal anneal is conducted.

In another embodiment, the device 100 may be subjected to an optional thermal anneal subsequent to conducting the laser anneal 410. As used herein, a thermal anneal is an anneal that is conducted in a conventional furnace, such as one that might be used in a rapid thermal anneal process or a flash lamp anneal. In one aspect, the thermal anneal is conducted at a temperature of about 1040° C. for a time of about 1.9 seconds, though other temperatures and times may also be used. The above-stated temperature and time have been found beneficial in achieving completion of activation of the dopants or recrystallization in those instances where further activation or recrystallization is necessary.

Following the thermal anneal, conventional processes may be used to deposit dielectric layers over the gate structures 130 and form interconnects within those dielectric layers to interconnect the gate electrodes in the appropriate manner.

Figure 5:
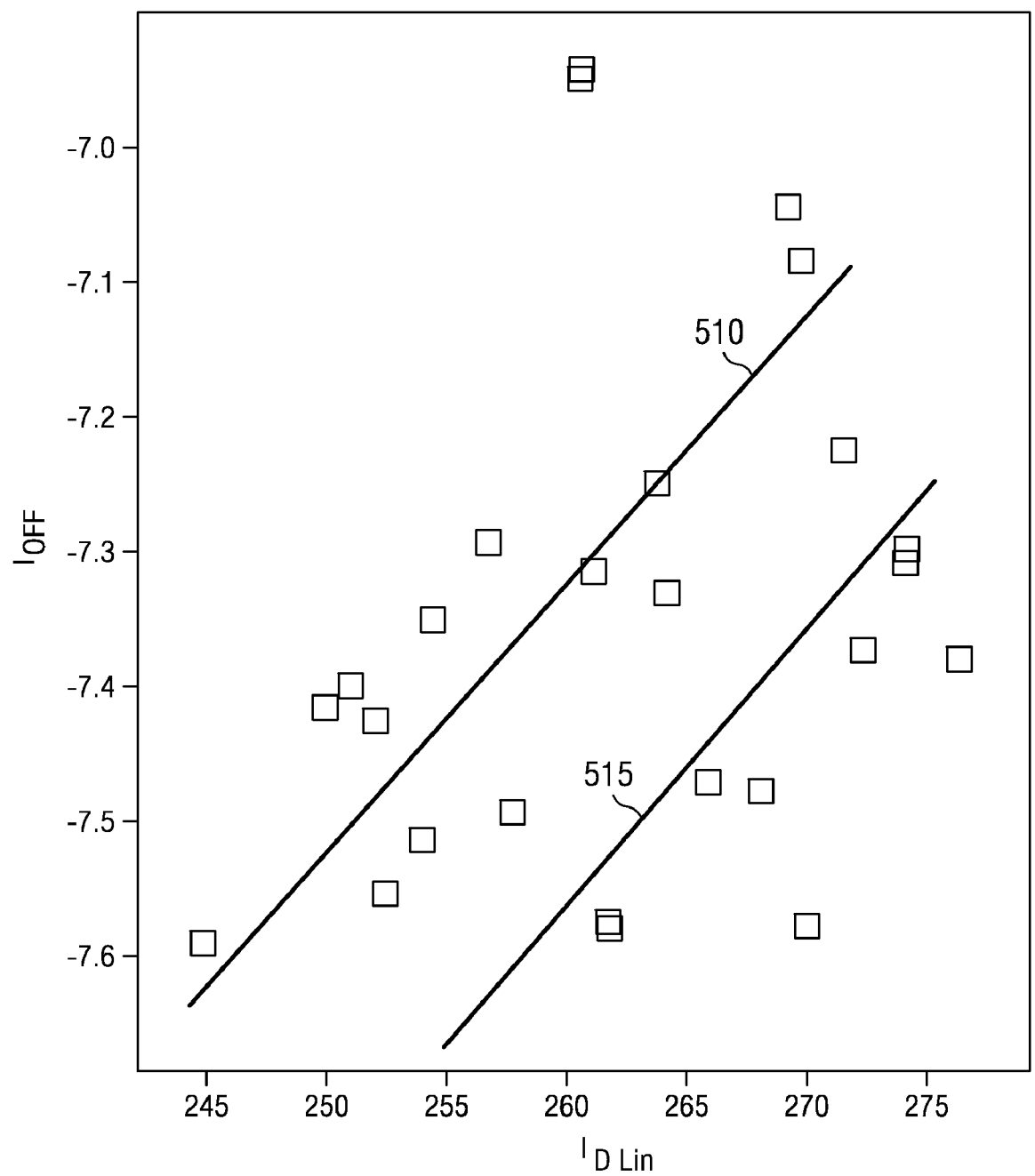
FIG. 5 illustrates a graph comparing $I_{off}/I_{D\,Lin}$ data of conventional devices with $I_{off}/I_{D\,Lin}$ data of devices fabricated in accordance with embodiments of the invention.

FIG. 5 illustrates a graph comparing $I_{off}/I_{D\,Lin}$ data of conventional devices, represented by line 510, with $I_{off}/I_{D\,Lin}$ data of devices fabricated in accordance with embodiments discussed herein, represented by line 515. $I_{off}$ is the leakage current of a transistor. For any given leakage, it is desirable that the $I_{on}$ (or $I_{D\,Lin}$) be has high as possible. Thus, for any given $I_{off}$ value it is beneficial if the $I_{on}$ can be improved. As seen in FIG. 5, the $I_{off}/I_{D\,Lin}$ of line 515 shows an improvement over the $I_{off}/I_{D\,Lin}$ of line 510, which equates to an improvement in transistor performance. For example, for an $I_{off}$ value of −7.5, the $I_{on}$ was improved over conventional devices from an $I_{on}$ value of about 251 to about 263. In this case, the leakage current was more easily overcome by an increase in the $I_{on}$ current.

Figure 6:
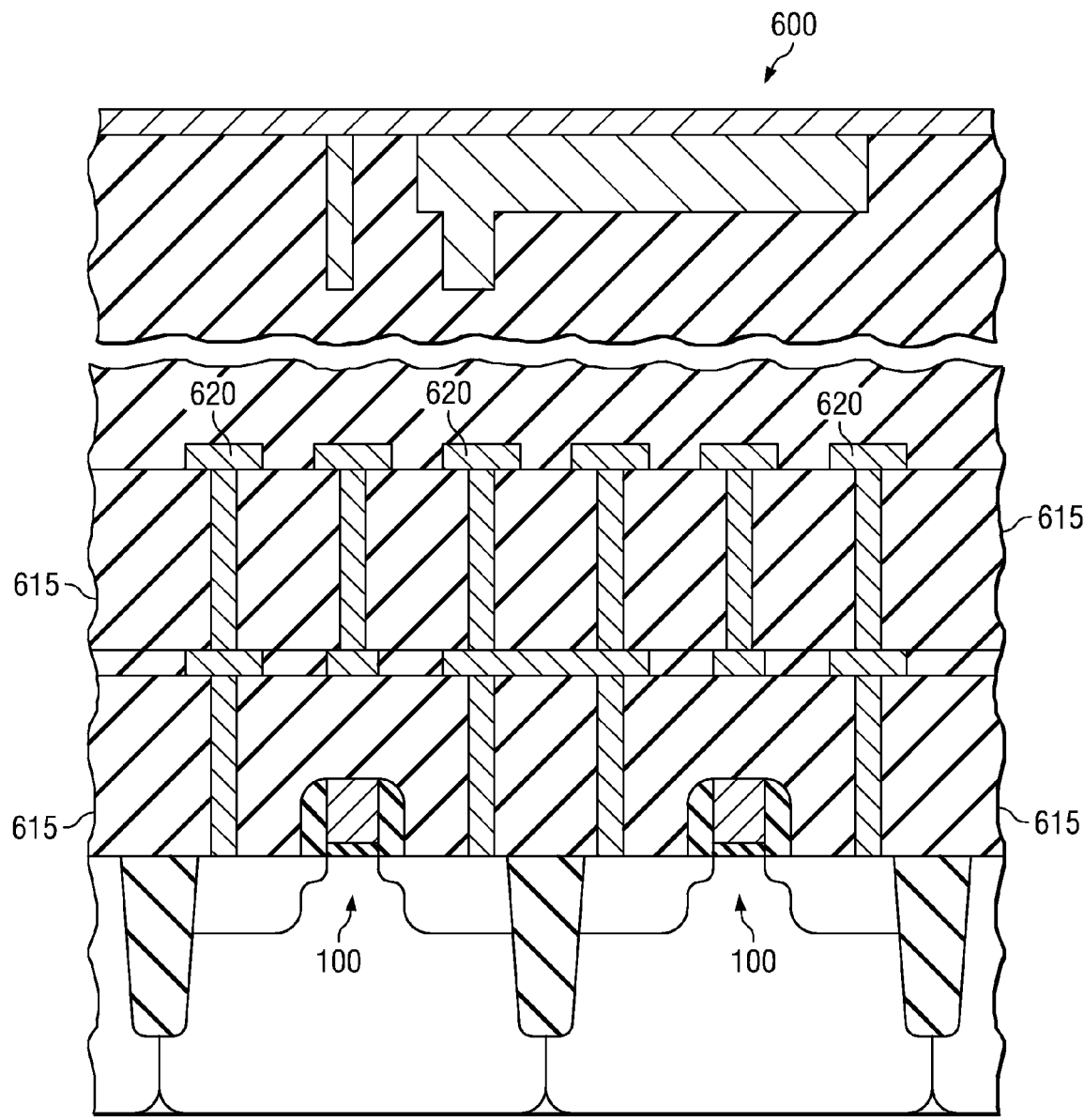
FIG. 6 illustrates an integrated circuit (IC) incorporating the semiconductor device fabricated in accordance with the invention and as illustrated in FIG. 1.

FIG. 6 illustrates the device 100 configured as or incorporated into an integrated circuit (IC) 600. The IC 600 includes devices 100 manufactured in a manner as discussed above and configured as complementary transistors. Dielectric layers 615, which may be formed using conventional processes and materials, are located over the transistors; and interconnects 620, which may be conventional interconnects, such as damascene or dual damascene (both of which are illustrated), are formed over and within the dielectric layers 615. The interconnects 620 connect other circuit components in the IC 600. Those who are skilled in the art would understand how to incorporate the device 100 into the IC 600.

Those skilled in the art will appreciate that other and further additions, deletions, substitutions and modifications may be made to the described embodiments without departing from the scope the disclosure set forth herein.

What is claimed is:

1. A method of manufacturing a semiconductor device, comprising:

forming silicon gate electrodes located over a semiconductor substrate, including forming amorphous regions in the silicon gate electrodes;

forming source/drain regions adjacent each of the silicon gate electrodes;

depositing an oxide layer over the silicon gate electrodes and the source/drains;

depositing a nitride layer over the oxide layer;

conducting a laser anneal on at least the silicon gate electrodes subsequent to depositing the nitride layer, the laser anneal being conducted at a temperature ranging from about 1100° C. to about 1350° C. for a period of time ranging from about 300 microseconds to about 2000 microseconds;

removing the nitride layer following the laser anneal; and subjecting the semiconductor device to a non-laser thermal anneal subsequent to conducting the laser anneal and after removing the nitride layer, the thermal anneal being conducted at a temperature ranging from about 1000° C. to about 1100° C. for a time ranging from about 0.6 seconds to about 2.0 seconds.

2. The method of claim 1, wherein the laser anneal recrystallizes at least a portion of the amorphous region and incorporates a stress into a channel region located between the source/drains.

3. The method of claim 1, wherein the nitride layer is deposited with a range of thickness of about 100 Å to about 800 Å.

4. The method of claim 1, wherein the thermal anneal is conducted by furnace heating at a temperature of about 1040° C. for a time of about 1.9 seconds.

5. The method of claim 2, wherein the laser anneal at least partially activates dopants in the source/drains; and wherein the thermal anneal completes recrystallization of the amorphous region and activation of the source/drains.

6. The method of claim 1, wherein the laser anneal is conducted at a temperature of about 1300° C. and for a time ranging from about 600 microseconds to about 800 microseconds.

7. The method of claim 1, wherein the semiconductor device is an integrated circuit, the gate electrodes and the source/drains form portions of transistors, and the method further includes forming dielectric layers over the transistors; and forming interconnect structures in the dielectric layers.

8. A method of manufacturing a semiconductor device, comprising:
forming gate electrodes over a semiconductor substrate;
forming source/drains adjacent each of the gate electrodes;
depositing a stress inducing layer over the gate electrodes;
conducting a laser anneal on at least the gate electrodes subsequent to depositing the stress inducing layer, the laser anneal being conducted at a temperature of at least about 1100° C. for a period of time of at least about 300 microseconds;
removing the stress inducing layer; and
subjecting the semiconductor device to a non-laser thermal anneal subsequent to conducting the laser anneal and removing the stress inducing layer.

9. The method of claim 8, wherein the laser anneal incorporates a stress into a channel region located between the source/drains.

10. The method of claim 8, wherein the stress inducing layer is a nitride layer having a thickness that ranges from about 100 Å to about 800 Å.

11. The method of claim 8, wherein the thermal anneal is conducted by furnace heating at a temperature of about 1040° C. for a time of about 1.9 seconds.

12. The method of claim 9, wherein the laser anneal at least partially activates dopants in the source/drains; and wherein the thermal anneal completes recrystallization of the amorphous region and activation of the source/drains.

13. The method of claim 8, wherein the laser anneal is conducted at a temperature of about 1300° C.; and the laser anneal is conducted for a time ranging from about 600 microseconds to about 800 microseconds.

14. The method of claim 8, wherein the semiconductor device is an integrated circuit, the gate electrodes and the source/drains form portions of transistors, and the method further includes forming source/drain regions adjacent the gate electrodes, the gate electrodes and source/drains forming portions of transistors; forming dielectric layers over the transistors; and forming interconnect structures in the dielectric layers.

15. A method of manufacturing a semiconductor device, comprising:
providing first and second gate structures formed over respective well regions isolated by isolation structures in a silicon substrate; each gate structure including a gate electrode and a gate dielectric that isolates the gate electrode from the well; the gate electrode formed by deposition and patterning of polysilicon; and at least one of the gate structures configured as an nMOS transistor device;
forming sidewall spacers on the sidewalls of the gate structures;
forming source/drains and source/drain extensions adjacent the respective gate structures by implantation of dopant into the substrate; the gate electrodes having amorphous regions established during at least one of the deposition of the polysilicon or the implantation of dopant to form the source/drains and source/drain extensions; and a channel region being defined between the source/drains;
depositing one or more layers of silicon dioxide as a protective layer over the gate structures, and over the adjacent source/drains and source/drain extensions;
depositing one or more layers of nitride material as a stress inducing layer over the protective layer and over the gate structures, and over the adjacent source/drains and source/drain extensions; the protective layer and stress inducing layer being deposited prior to activating the source/drains or source/drain extensions, and prior to recrystallization of the amorphous regions;
prior to performing any source/drain activation thermal anneal, performing a laser anneal on at least the gate electrodes subsequent to depositing the stress inducing layer to incorporate stress into the channel region, the laser anneal also at least partially recrystallizing the amorphous regions and activating the dopants in the source/drains and source/drain extensions; the laser anneal being conducted at a temperature of at least 1100° C. for a dwell time of not more than 2000 microseconds for each gate electrode;
removing the stress inducing layer following the laser anneal, using an etchant that is selective to the underlying protective layer; and
following the laser anneal and removal of the stress inducing layer, performing a non-laser thermal anneal to complete recrystallization of the amorphous regions and activation of the dopants in the source/drains and source/drain extensions.

16. The method of claim 15, wherein the laser anneal is conducted at a temperature less than 1350° C. for a dwell time of 600 to 800 microseconds.

17. The method of claim 16, wherein the thermal anneal is conducted by furnace heating at a temperature of 1000° C. to 1100° C. for a time of 0.6 to 2.0 seconds.

* * * * *